INSULATED-GATE FIELD EFFECT TRANSISTOR EXHIBITING A MAXIMUM SOURCE-DRAIN CONDUCTANCE AT A CRITICAL GATE BIAS VOLTAGE

Filed March 28, 1966

INVENTOR.
FRANK F. FANG

BY S. P. Tedesco

ATTORNEY

United States Patent Office 3,407,343

Patented Oct. 22, 1968

3,407,343

INSULATED-GATE FIELD EFFECT TRANSISTOR EXHIBITING A MAXIMUM SOURCE-DRAIN CONDUCTANCE AT A CRITICAL GATE BIAS VOLTAGE

Frank F. Fang, Yorktown Heights, N.Y., assignor to International Business Machines Corporation, Armonk, N.Y., a corporation of New York Filed Mar. 28, 1966, Ser. No. 537,833
13 Claims. (Cl. 317—235)

ABSTRACT OF THE DISCLOSURE

The monocrystalline semiconductor wafer defining the conduction channel of an insulated-gate field effect transistor is cut such that conduction valleys associated with the various crystal directions are nonequivalent under the influence of normal electric fields $E_n$. Accordingly, the surface conductivity $\sigma_s$ and, hence, source-drain conductance $g_{sd}$ exhibit a symmetrical change when normal electric fields are modulated at a critical intensity. By appropriately biasing the gate electrode, the insulated-gate field effect transistor can be used to achieve full-wave rectification or amplification with or without phase reversal.

This invention relates to insulated-gate field effect transistors and, more particularly, to insulated-gate field effect transistors operated so as to exhibit a symmetrical change in surface conductivity $\sigma_s$ when normal electric fields $E_n$ are modulated at a critical intensity.

At the present time, industry is directing much effort toward the development of solid-state circuit devices suitable for batch-fabrication processes whereby large numbers of such devices can be fabricated concurrently on a single semiconductor wafer along with functional interconnections therebetween. The objectives of such development are to reduce the size, weight, and unit cost of the individual circuit devices and, also, to improve reliability, speed, and power utilization from a system viewpoint.

Numerous solid-state circuit devices adaptable to batch-fabrication techniques have been described in both the scientific and patent literature. One such device is the insulated-gate field effect transistor which comprises, essentially, a metallic gate electrode spaced by a thin insulating layer from the surface of a block, or wafer, of appropriately doped monocrystalline semiconductor material and registered intermediate diffused-spaced portions of opposite conductivity type defining source and drain electrodes. The semiconductor wafer forms a constituent part of the insulated-gate field effect transistor in defining a conduction channel between source and drain electrodes and, also, provides support for the total structure. The basic structure of the insulated-gate field effect transistor lends itself to batch-fabrication due to the simplicity of the fabrication process; for example, source and drain electrodes can be formed during a single diffusion process and, also, the gate electrode and functional interconnections to and from the insulated-gate field effect transistor can be defined during a single metalization process.

The operation of an insulated-gate field effect transistor closely approximates that of a vacuum tube triode since it is a voltage-controlled device and source-drain current $I_{sd}$ is supported by a single-type carrier. Conduction in a field effect transistor is a surface mechanism wherein the density of majority carriers along an inverted conduction channel, i.e., the narrow surface portion of the semiconductor wafer intermediate the source and drain electrodes, is modulated by normal electric fields $E_n$ generated by gate electrode bias. Heretofore, field effect transistors have been used in circuit applications solely to perform amplification and gating functions. The use of field effect transistors has been limited to such functions since it was believed that the surface conductivity $\sigma_s$ increased sublinearly with increasing normal electric fields $E_n$, deviations from linearity being due to surface scattering of the majority carriers.

However, an anomalous effect has been observed when an insulated-gate field effect transistor is fabricated in particular fashion which renders such device capable of performing inherently, additional circuit functions. Such effect is dependent upon the particular crystal plane of the lattice of monocrystalline semiconductor material forming the wafer which is exposed to the normal electric fields $E_n$ and, also, upon the intensity of such normal electric fields $E_n$. Fundamentally, the semiconductor wafer is cut such that conduction valleys associated with the various crystalline directions are nonequivalent under the influence of normal electric fields $E_n$. When subjected to normal electric fields $E_n$ in excess of a critical intensity, surface conductivity $\sigma_s$ and, hence, source-drain conductance $g_{sd}$ decrease, rather than increase, with increasing field intensity.

Accordingly, an object of this invention is to provide novel circuit arrangements comprising an insulated-gate field effect transistor.

Another object of this invention is to provide an insulated-gate field effect transistor exhibiting a symmetrical change in surface conductivity $\sigma_s$.

Another object of this invention is to provide a novel full-wave rectifying circuit arrangement comprising a single insulated-gate field effect transistor structure.

These and other objects and advantages of this invention are obtained by forming an insulated-gate field effect transistor in a P-type semiconductor wafer which is cut such that some of the conduction valleys associated with each of the crystal directions are nonequivalently affected by normal electric fields $E_n$. In accordance with a proposed model, these conduction valleys are quantized by high-intensity normal electric fields $E_n$ according to the relevant effective-mass associated with the conduction electrons in associated crystal directions. A large effective-mass is associated with electrons in a first set of conduction valleys associated with the crystal direction perpendicular to the surface to which the normal electric fields $E_n$ are applied; on the other hand, a smaller effective-mass is associated with electrons in a second set of conduction valleys associated with crystal directions parallel to such surface. In effect, quantization of the first and second sets of conduction valleys by the normal electric fields $E_n$ "splits" the respective ground states whereby no electrons occupy the second, or higher-energy, set of conduction valleys. At this time, the conduction channel is inverted and source-drain conductance $g_{sd}$ is supported by electrons in the first, or lower-energy, set of conduction valleys. A critical intensity of normal electric fields $E_n$ is required to induce electrons into the second set of conduction valleys. In a quantized system, i.e., a two-dimensional lattice, and with increasing normal electric fields $E_n$, Fermi energy $E_f$ imparted to conduction electrons, which is proportional to $E_n$, increases at a faster rate than the "splitting" of the respective ground states of the first and second sets of conduction valleys, which is proportional to $E^{2/3}$. The second set of conduction valleys become occupied by electrons only when the normal electric fields $E_n$ are in excess of a critical intensity.

However, conduction electrons occupying the first set of conduction valleys exhibit a lower effective-mass along the surface than conduction electrons occupying the second set of conduction valleys. Accordingly, when increasing normal electric fields $E_n$ less than a critical intensity are applied, conduction is supported only by electrons in the first set of conduction valleys having a lower effective-mass, i.e., higher mobility $\mu_1$, whereby surface conductivity $\sigma_s$ increases sublinearly. When normal electric fields $E_n$ in excess of a critical intensity are applied, conduction is supported by conduction electrons occupying both first and second sets of conduction valleys. Since conduction electrons in the second set of conduction valleys exhibit a higher effective-mass, i.e., lower mobility $\mu_2$, the net effective mobility $\mu_3$ of the total electron conduction is reduced. However, since the density of electron states in the second set of conduction valleys, i.e., the contribution of such valleys to source-drain conductance $g_{sd}$, is greater than that of the first set of conduction valleys, surface conductivity $\sigma_s$ decreases rapidly with increasing normal electric fields $E_n$ above a critical intensity.

Since surface conductivity $\sigma_s$ of an NPN-type insulated-gate field effect transistor exhibits a maximum at a critical intensity of normal electric fields $E_n$, such devices can, inherently, perform numerous circuit functions other than amplification. For example, such a device can be used as a frequency doubler, or full-wave rectifier, by normally biasing the gate electrode to apply normal electric fields $E_n$ substantially equal to the critical intensity. An alternating input signal applied to the gate electrode, in effect, modulates the intensity of normal electric fields $E_n$ above and below this critical intensity whereby surface conductivity $\sigma_s$ is reduced during both positive and negative signal excursions so as to achieve full-wave rectification. Also, the biasing normal electric fields $E_n$ can be determined either below or above the critical intensity to effect amplification of the input signal with or without phase reversal.

The foregoing and other objects, features, and advantages of the invention will be apparent from the following more particular description of preferred embodiments of the invention, as illustrated in the accompanying drawings.

In the drawings:

FIGS. 2A and 2B depict input and output signal waveforms, respectively, of the circuit arrangement of FIG. 1.

Figures 1, 2, 3:
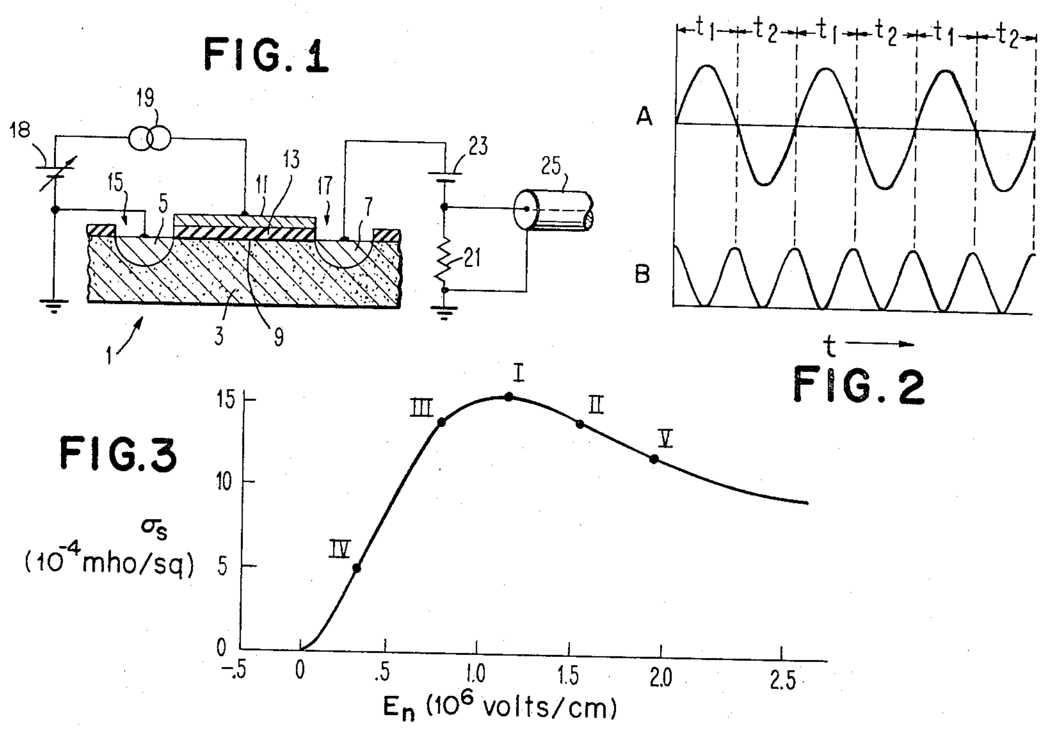
FIG. 1 is a schematic of a full-wave rectifying circuit arrangement comprising an insulated-gate field effect transistor in accordance with this invention.
FIG. 3 illustrates the variation of surface conductivity $\sigma_s$ as a function of normal electric fields $E_n$ of the insulated-gate field effect transistor of FIG. 1.

The full-wave rectifying circuit arrangement of FIG. 1 comprises an insulated-gate field effect transistor 1 formed in wafer 3 of relatively high-resistivity P-type semiconductor material, e.g., silicon, germanium, etc.; wafer 3 is cut to exhibit a particular surface, or crystal, orientation, as hereinafter described. Source and drain electrodes 5 and 7 of N-type conductivity are diffused into and define rectifying junctions with wafer 3. A metallic gate electrode 11 is registered over the surface portion of wafer 3 intermediate source and drain electrodes 5 and 7 and spaced therefrom by insulating layer 13. Conduction between source and drain electrodes 5 and 7 is primarily a surface conduction mechanism and occurs when surface portion 9, or conduction channel, of wafer 3 is inverted. The density of majority carriers, i.e., electrons, along conduction channel 9 is modulated by normal electric fields $E_n$ applied along conduction channel 9 when gate electrode 11 is biased. For the practice of this invention, an NPN field effect transistor structure is utilized since it is requisite that conduction be supported by free electrons.

When wafer 3 is formed of silicon, insulating layer 13 can be formed of thermally-grown silica ($SiO_2$) by exposing wafer 3 at a temperature between 900° C. and 1250° C. in an atmosphere of oxygen ($O_2$) and for a time sufficient to be formed of a thickness between 1000 A. and 5000 A. Insulating layer 13 should be continuous, i.e., pin-hole free, and capable of withstanding normal electric fields $E_n$ in excess of 1,000,000 volts/cm. As hereinafter described, normal electric fields $E_n$ of such intensity range are sufficient to quantize the nonequivalent conduction valleys associated with various crystalline directions, or planes, of monocrystalline silicon and, also, impart a sufficient Fermi energy $E_f$ to conduction electrons along conduction channel 9 whereby the anomalous effect used to advantage in this invention is obtained.

Insulating layer 13, when formed, can be used for masking during the diffusion of source and drain electrodes 5 and 7. For example, "diffusion windows" 15 and 17 are opened in insulating layer 13 by conventional photolithographic techniques. With insulating layer 13 acting as a diffusion mask, wafer 3 is heated at tempertures ranging from 1100° C. to 1250° C. in the reactive atmosphere, e.g., phosphorous pentoxide ($P_2O_5$), to form N-type source and drain electrodes 5 and 7. Subsequently, gate electrode 11 and also operative connections 5 and 7 can be formed over insulating layer 13 by conventional metalization processes. A more detailed description of the fabrication of an insulated-gate field effect transistor may be had by reference to patent application Serial No. 468,-481, filed on June 30, 1965, in the names of G. Cheroff et al., and assigned to the assignee of the present invention.

In forming field effect transistor 1, wafer 3 is cut to expose a surface orientation to normal electric fields $E_n$ generated by gate electrode 11 whereby conduction valleys associated with the crystal planes are nonequivalent. For purposes of description, silicon wafer 3 is cut to expose a surface normal to the [100] direction. It will be evident that numerous other monocrystalline P-type semiconductor materials exhibiting multiple conduction valleys which are nonequivalent under the influence of normal electric fields, e.g., [111] oriented germanium, etc., would be suitable for the practice of this invention.

The nonequivalent conduction valleys associated with the various crystal faces of silicon wafer 3, singe quantized by normal electric fields $E_n$, give rise to the surface conductivity characteristics illustrated in FIG. 3. As illustrated, the surface conductivity $\sigma_s$ increases sublinearly under the influence of increasing moderate normal electric fields $E_n$. Due to the character of the silicon-silicon dioxide interface, conduction channel 9 is normally inverted, i.e., the narrow surface portion of wafer 3 is essentially N-type. Under the influence of increasing normal electric fields $E_n$, the electron density along conduction channel 9 is increased, i.e., becomes more inverted, in proportion to the intensity of the normal electric fields $E_n$. Accordingly, the surface conductivity $\sigma_s$ is modulated by the applied normal electric fields $E_n$. As shown in FIG. 3, the slope of the surface conductivity $\sigma_s$ curve at higher intensities of normal electric fields $E_n$ decreases and approaches zero at a critical intensity of normal electric fields $E_n$. As the intensity of the normal electric fields $E_n$ is further increased, the slope of the surface conductivity $\sigma_s$ curve becomes negative and actually decreases with increasing fields. Such effect, as hereinafter described, is due (1) to the nonequivalency of conduction valleys associated with the crystal faces of P-type silicon wafer 3 to normal electric fields $E_n$ so as to be quantized unequally, i.e., the respective ground states are "split," and (2) to normal electric fields $E_n$ sufficient to impart a Fermi energy $E_f$ to conduction electrons slightly in excess of the respective ground states of the quantized, nonequivalent conduction valleys.

Accordingly, to effect full-wave rectification, variable DC bias voltage source 18 and AC input source 19 are connected in series between gate electrode 11 and ground; also, source electrode 5 is connected to ground. Load resistor 21 is connected in the circuit of drain electrode 7 along with drain bias source 23 of proper polarity and magnitude to support source-drain conductance $g_{sd}$. Gate bias source 18 is adjusted to bias gate electrode 11 and apply normal electric fields $E_n$ of critical intensity to maximize surface conductivity $\sigma_s$ along conduction channel 9 as indicated by point I. While field effect transistor 1 is critically biased, both positive and negative excursions of the AC input signal from source 19 and illustrated in FIG. 2A reduce the surface conductivity $\sigma_s$ of conduction channel 9. For example, during each positive excursion of the AC input signal during a time interval $t_1$, normal electric fields $E_n$ in excess of the critical intensity are applied along conduction channel 9. At this time, surface conductivity $\sigma_s$ shuttles to point II of FIG. 3 and a negative-going signal is developed across load 21 and directed along coaxial cable 25. Conversely, during each negative excursion of the AC input signal during a time interval $t_2$, the normal electric fields $E_n$ less than the critical intensity are applied along conduction channel 9. At this time, surface conductivity $\sigma_s$ is shuttled to point III of FIG. 3 and, again, a negative-going signal is developed across load 21 and directed along cable 25. As shown in FIG. 2B, the result is full-wave rectification, or frequency doubling, of the AC input signal supplied by source 19. Also, it is evident that frequency multiplication can be achieved by conventional feedback techniques and suitable filtering.

Also, field effect transistor 1 can be operated as a conventional amplifier or phasing device by appropriately biasing gate electrode 11. For example, bias source 18 can be eliminated or, alternatively, adjusted to bias field effect transistor 1 at point IV of FIG. 3 such that the maximum normal electric fields $E_n$ applied along conduction channel 9 do not exceed the critical intensity. During this time, the field effect transistor 1 operates conventionally to amplify the AC input signal from source 19. Alternatively, bias source 17 can be adjusted to bias field effect transistor 1 at point V of FIG. 3. At this time, the AC input signal of FIG. 2A is ineffective to reduce the intensity of the normal electric fields $E_n$ along the conduction channel 9 below the critical value whereby such signal is amplified with phase reversal.

Figure 4:
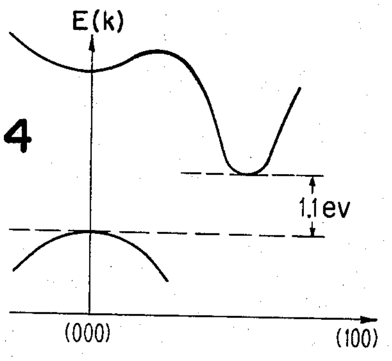
FIG. 4 is an energy band diagram in *k*-space of monocrystalline silicon.
Figure 5:
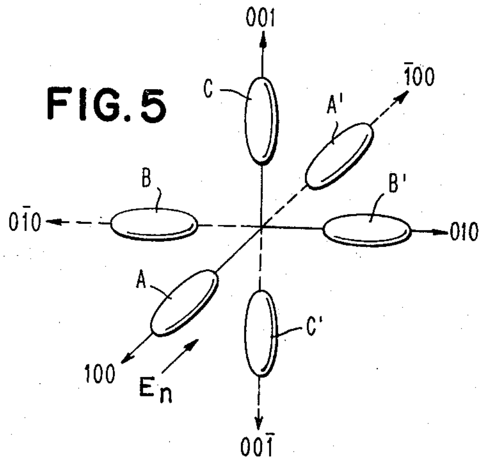
FIG. 5 illustrates the conduction valleys, or ellipsoids, associated with the crystal orientations of monocrystalline silicon.

The anomalous effect giving rise to the curve of FIG. 3 can be explained in terms of the quantization of electron states in the various conduction minima associated with the crystal lattice. For example, the energy band diagram in $k$-space of monocrystalline silicon is illustrated in FIG. 4, the conduction minima being along the [100] direction whereby conduction electrons are distributed in six conduction valleys, or ellipsoids, along the three equivalent directions of the crystal lattice. As shown in FIG. 5, conduction valleys A–A′ are associated with the 100–$\bar{1}$00 directions, respectively; conduction valleys B–B′ are associated with the 010–0$\bar{1}$0 directions, respectively; and valleys C–C′ are associated with the 001–00$\bar{1}$ directions, respectively. Source-drain conductance $g_{sd}$ along conduction channel 9 is supported by electrons in each of the conduction valleys A–A′, B–B′, and C–C′. During quiescent operation, i.e, gate electrode 11 is unbiased, the surface of wafer 3 at the silicon-silicon dioxide interface is nearly flat band and substantially no free conduction electrons are present along conduction channel 9. Under this condition, therefore, each of the conduction valleys A–A′, B–B′, and C–C′ can be considered as unoccupied.

Figure 6:
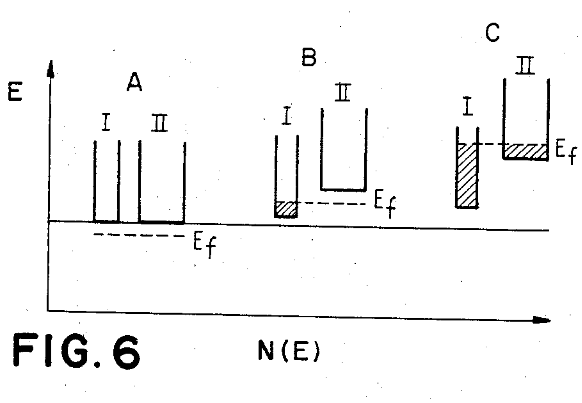
FIG. 6 is a two-dimensional representation of the density of electron states of the conduction valleys of FIG. 5 and illustrates the nonequivalency under quantization of such valleys by normal electric fields $E_n$.

A two-dimensional representation of the density of electron states in conduction valleys A–A′ is represented in FIG. 6 by valley I and of the combined density of states of valleys B–B′ and C–C′ by valleys II. As shown by A in FIG. 6, valleys I and II have a same ground state during quiescent operation. As illustrated, valley I has a two-fold degeneracy and represents a first set of conduction valleys A–A′; valley II has a four-fold degeneracy and represents a second set of equivalent conduction valleys B–B′ and C–C′. When normal electric fields $E_n$ are applied, i.e., along the [100] direction of the silicon lattice, conduction valleys I and II are quantized in this direction. Accordingly, in the [100] direction, conduction electrons in valley I, i.e., conduction valleys A–A′ of FIG. 5, have a longitudinal effective-mass $m_l$ which is equal to 0.98 $m_0$, where $m_0$ is the free electron mass; conduction electrons in valley II, i.e., conduction valleys B–B′ and C–C′, have a transverse effective-mass $m_t$ which is equal to 0.19 $m_0$.

The effects of the normal electric fields $E_n$ at the surface of wafer 3 are: (1) to induce electrons into conduction channel 9; (2) to increase the Fermi energy $E_f$ of electrons along conduction channel 9; and, (3) to quantize the available energy states in conduction valleys I and II. The energy levels of the quantized system are related to the effective-mass of conduction electrons in the respective conduction valleys in a direction normal to the surface of wafer 3. As hereinafter described, the minimum energy states, i.e., ground state, of conduction valley II is raised to a higher level than those in conduction valley I due to the lower relevant effective-mass of conduction electrons therein. Due to this quantization, the respective ground states of conduction valleys I and II, which under quiescent conditions are equal, are "split" as illustrated in B of FIG. 6.

During quiescent operation, i.e., the flat band condition, no conduction electrons occupy either conduction valleys I or II, i.e., valleys I and II are degenerated. As the intensity of normal electric fields $E_n$ is increased, conduction channel 9 becomes inverted whereby conduction electrons are available and, concurrently, conduction valleys I and II are quantized as illustrated in B of FIG. 6. Also, such conduction electrons have a sufficient Fermi energy $E_f$ to fill valley I, as indicated. At this time, the Fermi energy $E_f$ of the conduction electrons is less than the available energy states in conduction valley II and occupation of such valley by electrons is precluded. The rate at which conduction electrons fill conduction valley I goes at a faster rate than the "splitting" of the ground states of conduction valleys I and II. It can be shown that the Fermi energy $E_f$ imparted to conduction electrons is proportional to the intensity of normal electric fields $E_n$ whereas the "splitting" of the ground states of valleys I and II is proportional to a lower power of the field intensity, i.e., $E_n^{2/3}$.

For normal electric fields, say, less than 1,000,000 volts/cm., see FIG. 3, source-drain conductance $g_{sd}$ is supported by electrons in conduction valley I; such electrons exhibit a low transverse effective-mass $m_t$ and a relatively high mobility $\mu_1$ along the surface of wafer 3, i.e., perpendicular to the [100] direction of the lattice. At this time, there is essentially no contribution from conduction valley II as the Fermi energy $E_f$ of conduction electrons is below the ground state of valley II as shown in B of FIG. 6. As the intensity of the normal electric fields $E_n$ is further increased, surface conductivity $\sigma_s$ along conduction channel 9 increases as illustrated in FIG. 3. As the intensity of normal electric fields $E_n$ is further increased, the Fermi level $E_f$ of conduction electrons is raised and finally equals the ground state of conduction valley II. Further increases in the intensity of normal electric fields $E_n$, say, in excess of 1,000,000 volts/cm., results in the introduction of conduction electrons in conduction valleys I and II concurrently as shown in C of FIG. 6. Accordingly, electrons occupying both conduction valleys I and II now contribute to source-drain conductance $g_{sd}$. Furthermore, since the density of states in conduction valley II is much greater than in conduction valley I, the contribution of the more-degenerate conduction valley II to source-drain conductance $g_{sd}$ and, hence, surface conductivity $\sigma_s$ becomes more dominant as normal electric fields $E_n$ are increased above the critical intensity. Referring again to C of FIG. 6, electrons in conduction valley II, which corresponds to conduction valleys B–B′ and C–C′ of FIG. 4, have an effective-mass $m^*$ along the surface of wafer 3 which is determined by the geometric average of the longitudinal effective-mass $m_l$ and transverse effective-mass $m_t$, i.e., $m^* = \sqrt{m_l m_t}$. Accordingly, since the effective-mass $m^*$ of conduction electrons along the [100] surface occupying the conduction valley II is greater than the transverse effective-mass $m_t$ of conduction electrons occupying valley I, such electrons exhibit a mobility $\mu_2$ which is less than the mobility $\mu_1$ of conduction electrons in conduction valley I. At the critical intensity of normal electric fields $E_n$, the equivalent mobility $\mu_3$ of conduction electrons in all conduction valleys reaches a value such that $$\left|\frac{\Delta\mu_3}{\mu_3}\right| = \left|\frac{\Delta N}{N}\right|$$

where N is the number of total electrons. Accordingly, as normal electric fields $E_n$ are increased above the critical intensity, the number of electrons along conduction channel 9 increase whereby the equivalent mobility $\mu_3$ decreases and, hence, source-drain conduction $g_{sd}$ and surface conductivity $\sigma_s$ are reduced, the latter being indicated in the curve of FIG. 3.

While the invention has been particularly shown and described with reference to preferred embodiments thereof, it will be understood by those skilled in the art that various changes in form and details may be made therein without departing from the spirit and scope of the invention.

What is claimed is:

1. In a circuit arrangement, an insulated-gate field effect transistor comprising a monocrystalline semiconductor wafer of first conductivity type having a major surface and spaced portions of opposite conductivity type formed in said wafer defining source and drain electrodes, portions of said major surface intermediate said source and drain electrodes defining a conduction channel and having a particular crystal orientation to exhibit a maximum surface conductivity at a critical intensity of applied normal electric fields, gating means for applying normal electric fields along said conduction channel at least in excess of said critical intensity whereby said conduction channel exhibits a decreasing surface conductivity with increasing intensities of electric fields, and load means connected in the source-drain circuit of said field effect transistor.

2. In a circuit arrangement, an insulated-gate field effect transistor comprising a monocrystalline semiconductor wafer of first conductivity type and having spaced portions of opposite conductivity type defining source and drain electrodes, the narrow surface portion of said wafer intermediate said source and drain electrodes defining a conduction channel and having a particular crystal orientation to exhibit a substantially symmetrical change in surface conductivity when normal electric fields applied thereto are modulated at a critical intensity, said conduction channel exhibiting a maximum surface conductivity when normal electric fields of said critical intensity are applied thereto, gating means registered with said conduction channel and biased so as to apply normal electric fields of substantially said critical intensity along said conduction channel, additional means connected to said gating means for modulating the intensity of said normal electric fields applied along said conduction channel, and load means connected in the source-drain circuit of said field effect transistor.

3. In the circuit arrangement as defined in claim 2 wherein said gating means comprises a metallic gate electrode and a thin insulating layer intermediate said gate electrode and said conduction channel.

4. In the circuit arrangement as defined in claim 2 wherein said additional means includes an AC signal source.

5. In the circuit arrangement as defined in claim 2 wherein said semiconductor wafer consists of silicon and cut to expose a surface normal to the [100] crystal direction.

6. In the circuit arrangement as defined in claim 2 wherein said semiconductor wafer consists of germanium and cut to expose a surface normal to the [111] crystal direction.

7. In a circuit arrangement, an insulated-gate field effect transistor comprising a monocrystalline semiconductor wafer of first conductivity type and spaced diffused portions of opposite conductivity type formed in said wafer defining source and drain electrodes, portions of said surface intermediate said source and drain electrodes defining a conduction channel, said monocrystalline wafer being cut such that conduction valleys associated with the various crystalline directions are nonequivalent under the influence of normal electric fields whereby said conduction channel exhibits a maximum surface conductivity at a critical intensity of normal electric fields, gating means registered in insulated fashion with said conduction channel, and means for biasing said gating means to apply normal electric fields along said conduction channel at least in excess of said critical intensity whereby said conduction channel exhibits a decreasing surface conductivity with increasing intensities of electric fields, and load means connected in the source-drain circuit of said field effect transistor.

8. In the circuit arrangement as defined in claim 7 wherein said semiconductor wafer is formed of P-type silicon and cut to expose a surface normal to the [100] crystal direction.

9. In the circuit arrangement as defined in claim 7 wherein said semiconductor wafer is formed of P-type germanium and cut to expose a surface normal to the [111] crystal direction.

10. In the circuit arrangement as defined in claim 7 wherein said biasing means are effective to bias said gating means to apply normal electric fields in excess of $10^6$ volts/cm. along said conduction channel.

11. In the circuit arrangement as defined in claim 7 wherein said semiconductor wafer is formed of P-type silicon cut to expose a surface normal to the [100] direction and further comprising an insulating layer intermediate said narrow surface conduction channel and said gating means, said insulating layer being formed of silicon dioxide and in a thickness between 1000 A. and 5000 A.

12. In a circuit arrangement, an insulated-gate field effect transistor comprising a monocrystalline P-type semiconductor wafer and having N-type spaced portions defining source and drain electrodes, surface portions of semiconductor wafer intermediate said source and drain electrodes defining a conduction channel, said semiconductor wafer being cut to expose a surface orientation wherein conduction valleys associated with the various crystalline directions are nonequivalent and, hence, subject to quantization by normal electric fields such that said conduction channel exhibits a decreasing surface conductivity when subjected to increasing normal electric fields above a critical intensity, gating means for applying normal electric fields to said conduction channel in excess of said critical intensity, and load means connected in the source-drain circuit of said field effect transistor.

13. In a circuit arrangement as defined in claim 2 wherein said semiconductor wafer is formed of P-type semiconductor material and said spaced portions are formed of N-type semiconductor material.

References Cited

UNITED STATES PATENTS

| | | | |
|---|---|---|---|
| 3,204,160 | 8/1965 | Sah | 317—235 |
| 3,246,173 | 4/1966 | Silver | 307—88.5 |
| 3,045,129 | 7/1962 | Atalla | 307—88.5 |
| 3,088,856 | 5/1963 | Wannlund et al. | 148—33 |

JOHN W. HUCKERT, *Primary Examiner.*

M. EDLOW, *Assistant Examiner.*